United States Patent [19]
Ota

[11] Patent Number: 6,094,255
[45] Date of Patent: Jul. 25, 2000

[54] PROJECTION EXPOSURE APPARATUS AND METHOD THAT FLOATS A PLATE

[75] Inventor: Kazuya Ota, Tokyo, Japan

[73] Assignee: Nikon Corporation, Tokyo, Japan

[21] Appl. No.: 09/016,934

[22] Filed: Feb. 2, 1998

[30] Foreign Application Priority Data

Feb. 4, 1997 [JP] Japan .................................. 9-035537

[51] Int. Cl.⁷ .......................... G03B 27/62; G03B 27/60; G01B 11/00; G05B 1/06
[52] U.S. Cl. .............................. 355/75; 355/73; 356/401; 318/653
[58] Field of Search .............................. 430/20; 356/399, 356/400, 401; 355/75, 73, 53, 72; 318/653

[56] References Cited

U.S. PATENT DOCUMENTS

| | | |
|---|---|---|
| 4,485,339 | 11/1984 | Trost . |
| 4,506,204 | 3/1985 | Galburt . |
| 5,260,580 | 11/1993 | Itoh et al. . |
| 5,471,279 | 11/1995 | Takizawa .................................. 355/73 |
| 5,657,130 | 8/1997 | Shirasu et al. .......................... 356/401 |
| 5,906,901 | 5/1999 | Tanimoto ................................. 356/400 |

FOREIGN PATENT DOCUMENTS 59-219931  12/1984  Japan .

OTHER PUBLICATIONS

The Bell System Technical Journal, (Step and Repeat Camera), Nov. 1970, Eastman Kodak, Rochester, New York, pp. 2158–2167.

*Primary Examiner*—Safet Metjahic
*Assistant Examiner*—Peter P. Kim
*Attorney, Agent, or Firm*—Oliff & Berridge, PLC

[57] ABSTRACT

A projection exposure apparatus controls the position of a mask so that the mask is in a desired position without reducing throughput even if the size of the mask is increased. For example, a controller adjusts the pressure of air blown from air holes so that a reticle is floated at a desired distance above a reticle floating plate. The controller also controls the driving of linear motors having stators and sliders, thereby adjusting the pressing force of control bars in contact with the sides of the floating reticle to press the sides of the reticle and control the two-dimensional position of the reticle. Therefore, it is possible to control a mask so that the mask is placed in a desired position without reducing throughput.

29 Claims, 6 Drawing Sheets

PROJECTION EXPOSURE APPARATUS AND METHOD THAT FLOATS A PLATE

BACKGROUND OF THE INVENTION

Incorporation by Reference

The disclosure of the following priority application is herein incorporated by reference:

Japanese Patent Application No. 9-035537 filed Feb. 4, 1997.

1. Field of Invention

The present invention relates to a projection exposure apparatus, and more particularly, to a projection exposure apparatus that projects, by exposure, an image of a pattern formed on a mask onto a reactive substrate via a projection optical system and controls the position of the mask by applying force directly to the mask.

2. Description of Related Art

A lithography process typically is used in manufacturing semiconductor devices, liquid crystal devices, and the like. A projection exposure apparatus is used in this lithography process. The projection exposure apparatus illuminates a mask (hereinafter also referred to as a reticle) with a pattern formed thereon and projects by exposure an image of the pattern formed on the mask via a projection optical system onto a wafer or a glass substrate (hereinafter also referred to as a reactive substrate). The reactive substrate is located at a position conjugate with a pattern surface of the mask and coated with a resist.

Known projection exposure apparatus of this type are, for example, (1) a reduction projection exposure apparatus using the step-and-repeat method (called a stepper), and (2) a scanning exposure apparatus using the step-and-scan method. In the step-and-repeat method, a reactive substrate is laid on a substrate stage, which is movable in two dimensions (X and Y directions), and stepped by the substrate stage (stepping). Using this method, a pattern image on a reticle is sequentially projected by exposure onto a plurality of shot regions on the reactive substrate. In the step-and-repeat method, the entire mask pattern is exposed onto a shot region at one time. The step-and-scan method repeats, by the above-mentioned stepping operation, an operation of sequentially projecting a pattern image formed on a reticle onto shot regions on a reactive substrate while relatively scanning the reticle and the reactive substrate with respect to a projection optical system. That is, in the step-and-scan method, the reticle and substrate are both moved (in synchronism) during exposure. In contrast to the step-and-repeat method, the step-and-scan method exposes each shot region piece-by-piece instead of all at once.

In these projection exposure apparatus, for example, a reticle is fixed on a reticle stage, which is movable in the two-dimensional plane, by a vacuum chuck or the like. The position of the reticle stage is measured by projecting an interferometric beam from an interferometer onto a planar reflecting surface (e.g., movable mirror) located on the reticle stage and controlled according to this positional information. As a result, the position of the reticle is indirectly controlled via the reticle stage.

In the above-mentioned conventional projection exposure apparatus, the demands for throughput have become more exacting year after year. Although there has recently been in use, for example, a method of exposing a plurality of chips simultaneously, this causes the size of the shot region to be increased and the size of the reticle is also thereby increased. However, since, as mentioned above, the reticle is mounted on the reticle stage in the conventional projection exposure apparatus, the increase in size of the reticle inevitably results in an increased size of the reticle stage. As a result, the weight of the entire reticle stage, whose position is to be controlled, is increased remarkably. Since F=ma, the increase in size of the reticle is not preferable for position control. In particular, since the scanning projection exposure apparatus repeats operations of accelerating the reticle to the scanning velocity, performing exposure, decelerating, and stopping the reticle, if the weights of the reticle and the reticle stage are increased as mentioned above, the acceleration and deceleration are restricted, and throughput is reduced.

Furthermore, since the reticle is fixed on the reticle stage by a vacuum chuck or the like in the conventional projection exposure apparatus, if the size of the reticle stage is increased, the force applied to the reticle during scanning exposure will be greater, and there is a possibility that the reticle cannot be held by the vacuum chuck and will be displaced.

Further still, when the reticle is fixed by the vacuum chuck or the like, it is prone to be bent by vacuum adsorption, which has an adverse effect on imaging characteristics.

For an example of a system in which a stage is supported by fluid bearings, see U.S. Pat. No. 5,260,580. For examples of systems in which stages are supported by electromagnetic forces, see U.S. Pat. No. 4,485,339 and U.S. Pat. No. 4,506,204.

SUMMARY OF THE INVENTION

The present invention has been made in view of such disadvantages of the prior art, and one object of the invention is to provide a projection exposure apparatus capable of controlling the position of a mask so that the mask is placed in a desired position, without reducing throughput even if the size of the mask is increased.

Another object of the invention is to provide a projection exposure apparatus capable of performing scanning exposure without reducing throughput even if the size of the mask is increased.

Still another object of the invention is to provide a projection exposure apparatus capable of transferring a pattern image having good imaging characteristics onto a reactive substrate while controlling the position and inclination of a mask in the direction of gravity.

Yet another object of the invention is to provide a projection exposure apparatus capable of precisely measuring the position of a mask in the scanning direction without any influence from fluctuations in the surrounding air.

One embodiment of the invention provides a projection exposure apparatus for projecting an image of a pattern formed on a mask onto a reactive substrate via a projection optical system. The projection exposure apparatus includes a floating apparatus that floats or levitates the mask so that the mask does not contact any surface of the floating apparatus. The position of the mask in a plane is controlled in accordance with measurements taken by a position measuring apparatus and controlled by pressing the sides of the mask.

When the mask is floated, the position of the mask in the plane is measured and a controller section controls a position control apparatus in accordance with the mask position measured by the position measuring apparatus. Since the position of the mask is thus controlled by directly pressing the mask in a floating position, even if the size of the mask is increased, only the mass of the mask will be greater (as opposed to the mask and the mask stage), and a sufficient acceleration can be obtained by a small driving force, which improves position controllability. Moreover, since the mask is not adsorbed onto a mask stage by a vacuum chuck or the like, it is possible to prevent bending of the mask.

This projection exposure apparatus is not particularly limited to a stationary type (for example, a stepper) or a scanning type (for example, a step-and-scan type). The projection exposure apparatus may further include a moving mechanism for moving the reactive substrate in a substrate scanning direction so that the controller directs the position control apparatus to move the mask in a mask scanning direction, and synchronously directs the moving mechanism to move the reactive substrate in the substrate scanning direction. An image of a pattern formed on the mask is thereby projected onto the reactive substrate via the projection optical system by scanning exposure. Since the scanning projection exposure apparatus thus dynamically moves the mask in the mask scanning direction during exposure, it is possible to substantially improve the throughput. That is, even if the size of the mask is increased, the acceleration of the mask can be increased by the position control apparatus pressing the side of the mask.

Although the floating position of the mask in the direction of gravity may be fixed in the above example, the projection exposure apparatus may further measure the position and inclination of the floating mask in the direction of gravity. In this case, the floating apparatus can separately adjust the gap between the floating mask and a surface of the floating apparatus at three or more points so that the controller controls the floating position of the mask via the floating apparatus. This control is based on the position and inclination of the mask in the direction of gravity measured by a gravity-direction position measuring apparatus. Since this makes it possible to easily correct the position and inclination of the floating mask in the direction of gravity, proper position of the mask in the direction of gravity is maintained, and a proper pattern image can be exposed.

Control may be executed in moving the mask in the mask scanning direction so that the mask makes, in turn, an accelerating motion, a uniform (constant speed) motion, and a decelerating motion while the side thereof is always pressed by the position control apparatus. However, the controller may accelerate the mask by pressing one side of the mask orthogonal to the mask scanning direction by the position control apparatus at the beginning of scanning, perform scanning exposure without the mask contacting the position control apparatus after the velocity of the mask reaches the scanning velocity, and decelerate the mask by receiving (contacting) the other side of the mask orthogonal to the mask scanning direction by the position control apparatus after the completion of scanning exposure.

Furthermore, systems other than an interferometer may be used as the position measuring apparatus for measuring the positions of the mask in the mask scanning direction and in the direction orthogonal thereto. For example, the position measuring apparatus may measure the position of the mask in the mask scanning direction by radiating light onto a grating mark formed on the side of the mask parallel to the mask scanning direction. Since the position of the mask in the mask scanning direction can be measured by radiating the light onto the grating mark formed on the side of the mask parallel to the mask scanning direction, it is possible to prevent a detection error that can occur in interferometer systems resulting from fluctuations in the surrounding air.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

A first embodiment of the present invention will be described below with reference to FIGS. 1 to 4.

Figure 1:
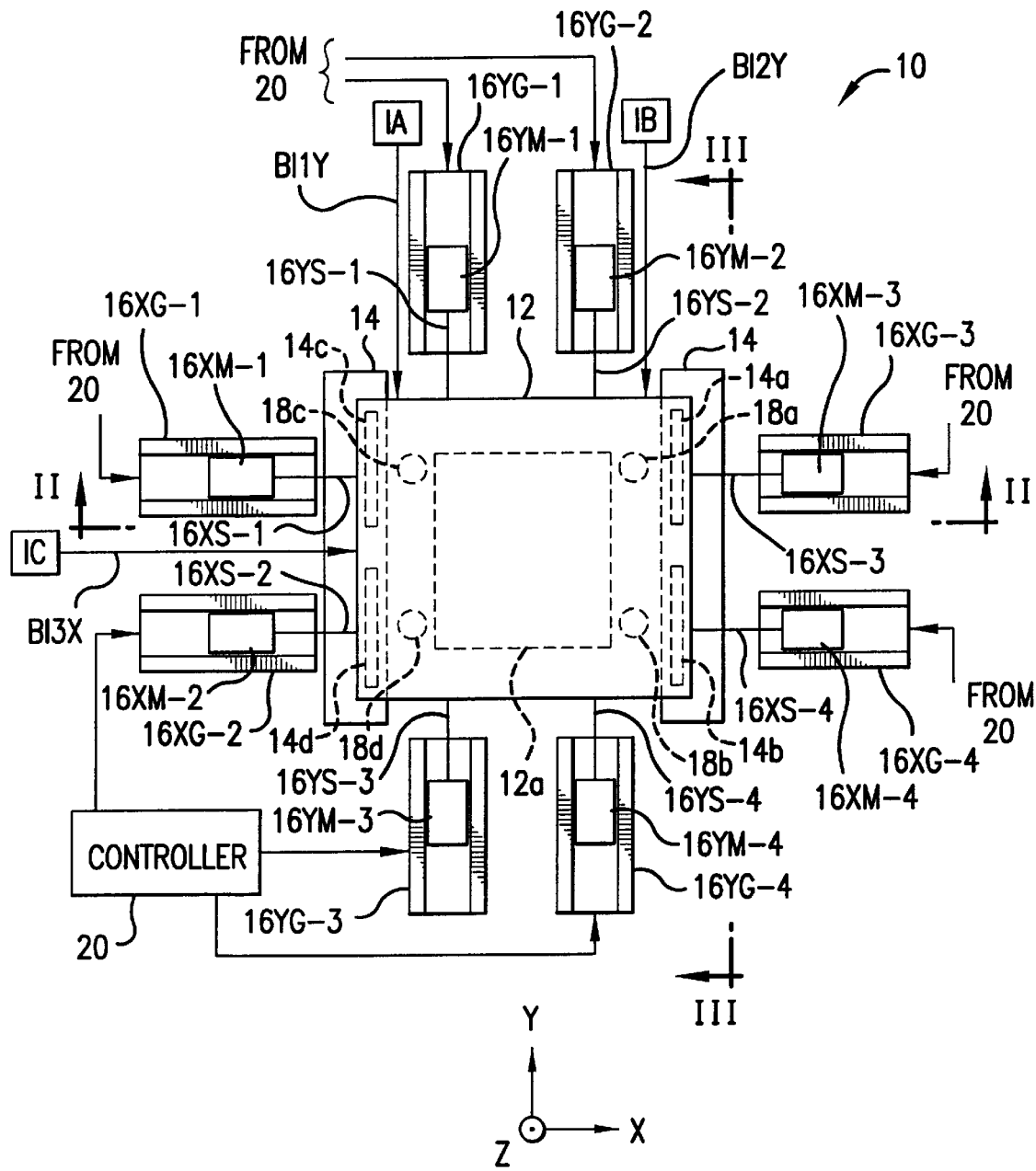
FIG. 1 is a plan view showing the schematic structure of a projection exposure apparatus according to a first embodiment of the invention.
Figure 2:
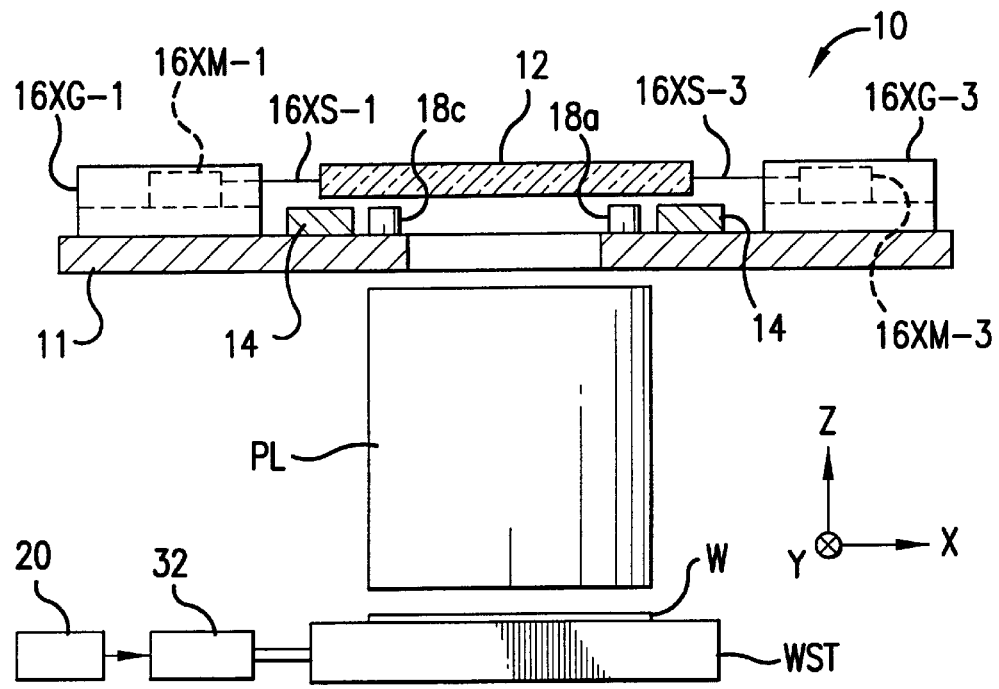
FIG. 2 is a cross-sectional view taken along the line II—II in FIG. 1.
Figure 3:
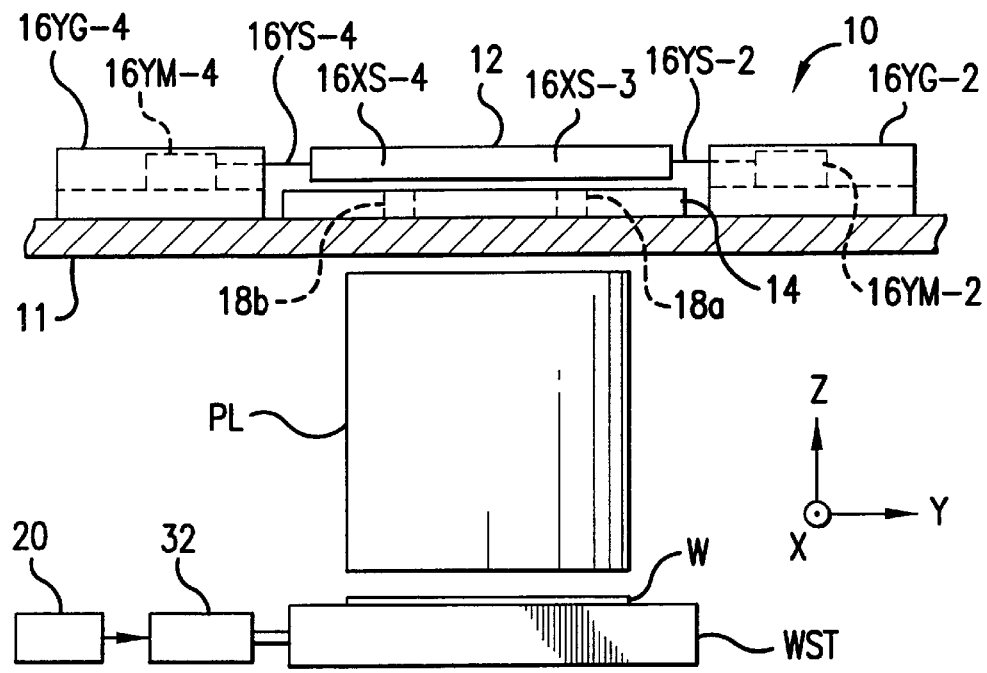
FIG. 3 is a cross-sectional view taken along the line III—III in FIG. 1.

The projection exposure apparatus 10 according to the first embodiment is characterized in having a reticle driving mechanism that can control the planar position of a reticle by directly driving the reticle without using (i.e., without driving) a reticle stage. The projection exposure apparatus 10 of the first embodiment is a reduction projection exposure apparatus (wafer stepper) of a so-called step-and-repeat type. FIGS. 1 to 3 illustrate in detail the reticle driving mechanism for controlling the position of the reticle by directly driving the reticle.

The projection exposure apparatus 10 has, as shown in FIG. 2, a reticle base plate 11 located in the horizontal direction (right-to-left in FIG. 2) directly above a projection optical system PL. Reticle floating plates 14 are located on the reticle base plate 11 and serve as a floating apparatus for floating a reticle 12 as a mask having no contact with floating plate 14. A reticle driving mechanism (reticle driver) 16 serves as a position control apparatus for controlling the position of the reticle 12 in the plane by pressing the sides of the reticle 12 floated by the reticle floating plates 14. An interferometric system, or the like, serves as a position measuring apparatus for measuring the position of the reticle 12 in the two-dimensional plane. Gap sensors 18a to 18d serve as a gravity-direction position measuring apparatus for measuring the gap between the reticle 12 and the projection optical system PL. A controller 20 (see FIG. 1) controls reticle driving mechanism 16 based on the reticle position measured by, for example, the interferometric system.

The reticle floating plates 14, each provided with many minute air holes formed on the upper surface thereof, blow air (or inert gas, or the like) out from the air holes toward the lower surface of the reticle with a required pressure to thereby float and support the reticle 12 in a position where the blowing pressure and the weight of the reticle 12 are in balance. The pressure of air blown from the air holes formed on the reticle floating plates 14 can be controlled in groups (for example, air hole groups 14a to 14d dispersed at four corners of the reticle as shown in FIG. 1) and the gap between the air holes and the reticle can be adjusted by adjusting the air blowing pressure.

In the first embodiment, as shown in FIG. 1, two of the control bars 16YS-1 to 16YS-4 and 16XS-1 to 16XS-4 are placed on each of four sides of the reticle 12. The position of the reticle 12 is controlled in accordance with the balance among the pressing forces of the control bars in contact with the sides of the reticle 12. The reticle driving mechanism 16 includes linear motors (linear driving devices) respectively composed of stators 16YG-1 to 16YG-4 and 16XG-1 to 16XG-4, each of which contains a primary core located linearly inside thereof and has a U-shaped cross-section, and sliders 16YM-1 to 16YM-4 and 16XM-1 to 16XM-4, each of which contains a secondary core movable along a U-groove of each stator. The control bars are attached to the leading ends of the sliders 16YM-1 to 16YM-4 and 16XM-1 to 16XM-4 so that they point in the moving direction of the sliders. The control bars 16YS-1 to 16YS-4 and 16XS-1 to 16XS-4 control the position of the reticle 12 in the plane by linearly moving the sliders 16YM-1 to 16YM-4 and 16XM-1 to 16XM-4 along the stators 16YG-1 to 16YG-4 and 16XG-1 to 16XG-4 by means of the controller 20, which will be described later, and by thereby moving the leading ends of the control bars 16YS-1 to 16YS-4 and 16XS-1 to 16XS-4 to desired positions so as to press (contact, engage) the sides of the reticle 12. The reticle 12 is moved in a desired moving direction by pushing out (extending) two control bars on one side of the reticle and pulling back (retracting) the two control bars on the opposite side of the reticle. In this case, the control bars opposed to each other are controlled so that they are always applying pressing force to the reticle 12, in order to always execute positional control of the reticle 12, and move the reticle 12 by changing the balance between the pressing forces. To change the pressing force of each control bar, the driving thrust of each linear motor is changed by changing the amount of driving current supplied to the linear motor. The first embodiment employs, as an example, what are called moving-magnet linear motors.

The interferometric system has two interferometers IA and IB for projecting light along measuring axes BI1Y and BI2Y (FIG. 1), serving as interferometric beams, onto one side (the upper side in FIG. 1) of the reticle 12 parallel to the X-axis direction (right-to-left in FIG. 1), and one interferometer IC for projecting light along a measuring axis BI3X, serving as an interferometric beam, onto one side (the left side in FIG. 1) of the reticle 12 parallel to the Y-axis direction. The position of the reticle 12 in the Y-axis direction is measured by using measured values of the measuring axes BI1Y and BI2Y. The amount (θ) of yawing of the reticle 12 about the Z axis, which is perpendicular to the XY plane (perpendicular to the paper in FIG. 1), is detected based on the difference between the two measured values of the measuring axes BI1Y and BI2Y and the distance between the measuring axes. The position of the reticle 12 in the X-axis direction is measured by using a measured value of the measuring axis BI3X.

The gap sensors 18a to 18d are, as shown in FIGS. 1 to 3, placed at four positions on the reticle base plate 11, and respectively measure the gaps between the gap sensors 18a to 18d and the reticle 12 in the direction of gravity (in the Z-axis direction in the figures). The gap between the reticle 12 and the projection optical system PL or the direction and amount of inclination of the reticle can be calculated by the controller 20 or the like based on measured values of the gap sensors 18a to 18d. Various types of displacement sensors may be used as the gap sensors 18a to 18d. In one example, semiconductor optical position detectors (PSD: Position Sensitive Detectors) are employed. Gap data detected by the gap sensors 18a to 18d are input to the controller 20 (described later) and used to control the gap between the reticle 12 and the projection optical system PL. As an alternative to the displacement sensors described above, displacement sensors using, for example, capacitance and eddy current may be used. Also, the number of displacement sensors used can differ from the four sensors used in this example.

Figure 4:
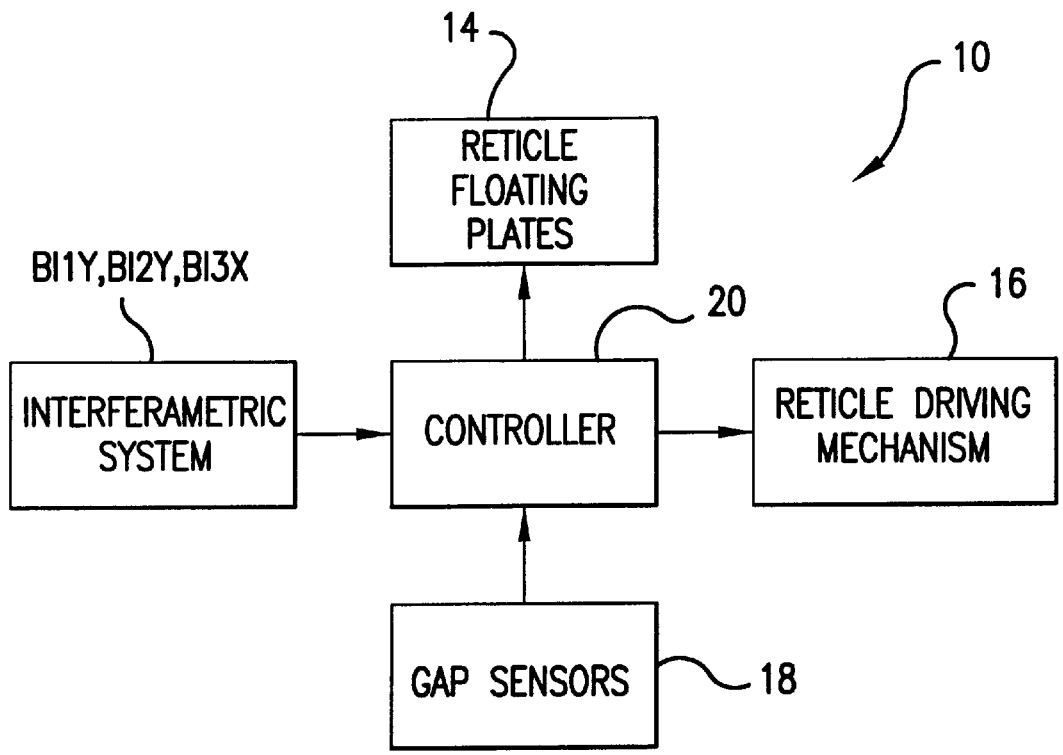
FIG. 4 is a schematic block diagram of a control system according to the first embodiment.

The controller 20 is connected to the above components and controls the entire projection exposure apparatus 10. For example, as shown in FIG. 4, the controller 20 exchanges signals and data with the reticle floating plates 14, the reticle driving mechanism 16, the interferometric system IA–1C, the gap sensors 18, and the like, and feedback-controls the position of the reticle 12 in the plane and in the Z-axis direction (including the inclination of the reticle). That is, since the projection exposure apparatus 10 of the first embodiment is a stepper that aligns the reticle and the wafer and performs static exposure, it is required that the reticle 12 be placed into a required position and held at the position during exposure. Accordingly, the controller 20 controls the reticle driving mechanism 16 based on the planar position of the reticle 12 measured by using the measuring axes BI1Y, BI2Y, and BI3X of the interferometric system, thereby controlling the position of the reticle 12 in the plane (the XY plane). The controller 20 also controls the position of the reticle 12 in the Z-axis direction by separately controlling the blowing pressures of air from the air holes 14a to 14d formed on the reticle floating plates 14. An inappropriate gap between the reticle 12 and the projection optical system PL affects the resolution and magnification of a pattern image to be projected onto a wafer W.

The reticle 12 used in the first embodiment is formed of, for example, a glass plate having a thickness of about 6 mm (0.25 inch) and a size of about 10 inches square, and is provided with a desired pattern image formed in a pattern forming region 12a by, for example, evaporating Cr (chrome) therein.

According to the projection exposure apparatus 10, a pattern on the reticle 12 is illuminated with exposure light from an unillustrated illumination optical system, and an image of the pattern is projected onto the wafer W via the projection optical system PL by exposure. When exposure for a shot region is completed, a wafer stage WST is stepped by a wafer stage driving mechanism 32 so that the next shot region on the wafer W is positioned in an exposure region of the projection optical system PL, and the exposure process is subsequently repeated.

Next, an operation of controlling the position of the reticle 12 in the projection exposure apparatus 10 having the above structure will be described.

Before exposure is performed by the projection exposure apparatus 10 shown in FIG. 1, the controller 20 first transports and places the reticle 12 into a delivery position (for example, the position of the reticle 12 shown in FIG. 1) on the reticle floating plates 14 by controlling an unillustrated reticle loader. The controller 20 measures the planar position of the reticle 12 loaded on the reticle floating plates 14 by using, for example, the measuring axes BI1Y, BI2Y, and BI3X of the interferometric system, and controls the positions of the sliders 16YM-to 16YM-4 and 16XM-1 to 16XM-4 so that the leading ends of all the control bars 16YS-1 to 16YS4 and 16XS-1 to 16XS-4 are close to the sides of the reticle 12.

Next, the controller 20 blows air from the air holes 14a to 14d on the reticle floating plates 14 at a required pressure, and thereby floats the reticle 12 in a position where the blowing pressure and the weight of the reticle 12 are in balance, for example, a position several micrometers above the upper surfaces of the plates 14. Even though the reticle 12 is floated, it can be prevented from substantially displacing in the XY plane because the control bars 16YS-1 to 16YS-4 and 16XS-1 to 16XS-4 are placed close to the sides of the reticle 12 as mentioned above.

The controller 20 further measures the gaps between the gap sensor positions and the reticle 12 in the Z-axis direction by using, for example, the gap sensors 18a to 18d while the reticle 12 is floating. The controller then adjusts the pressures of air blown out of the air holes 14a to 14d of the reticle floating plates 14, and thereby executes feedback-control so that the reticle 12 is placed in a required reference position. In this case, for example, a reticle for testing is floated in a required position, and the imaging characteristics of the projection optical system PL are adjusted in advance so that they are most appropriate when the reticle is in that position, whereby the position of the reticle that provides the most appropriate imaging characteristics can be taken as the reference position.

The controller 20 executes control so that the reticle 12 is floated in the reference position, and respectively controls the driving of the sliders 16YM-1 to 16YM-4 and 16XM-1 to 16XM-4 of the linear motors so that the sides of the reticle 12 are pressed with equal pressure by the control bars in contact therewith. The reticle 12 can be thereby held stationary at a required position in the plane while floating in the reference position. FIGS. 2 and 3 are side views showing this state, as viewed from the X-axis side and the Y-axis side, respectively.

Although a target position of the reticle 12 in the plane is determined by reticle alignment performed by using a reticle microscope and a reference plate, which are not shown, during exposure the reticle 12 is controlled so that it precisely follows the motion of the wafer W (the wafer stage WST).

As mentioned above, according to the first embodiment, since the position of the reticle 12 in the plane is controlled while the sides of the reticle 12 are directly pressed by the control bars, the weight to be controlled is substantially reduced compared with the conventional case in which the position of the reticle stage with the reticle 12 mounted thereon is controlled. Controllability of the reticle position is therefore enhanced.

Furthermore, since the first embodiment controls the position of the reticle 12 while floating the reticle 12 on air blown out of the air holes 14a to 14d formed on the reticle floating plates 14, the reticle 12 can be moved by a small driving force. Further still, since exposure is performed while the reticle is floating, the reticle is prevented from being bent due to adsorption (in contrast to fixing the reticle on a reticle stage by a vacuum chuck) which makes it possible to transfer a proper pattern image onto the wafer W. In addition, since the reticle is floated in the first embodiment, the leveling (inclination) of the reticle can easily be adjusted by separately controlling the pressures of air blown out of the air holes 14a to 14d formed on the reticle floating plates 14 based on data (from the gap sensors 18a to 18d) regarding gaps between the gap sensors 18a to 18d and the reticle 12.

Next, a second embodiment of the present invention will be described with reference to FIG. 5. Components that are identical with or equivalent to those in the above-mentioned first embodiment are denoted by the same numerals, and a description thereof is omitted.

Figure 5:
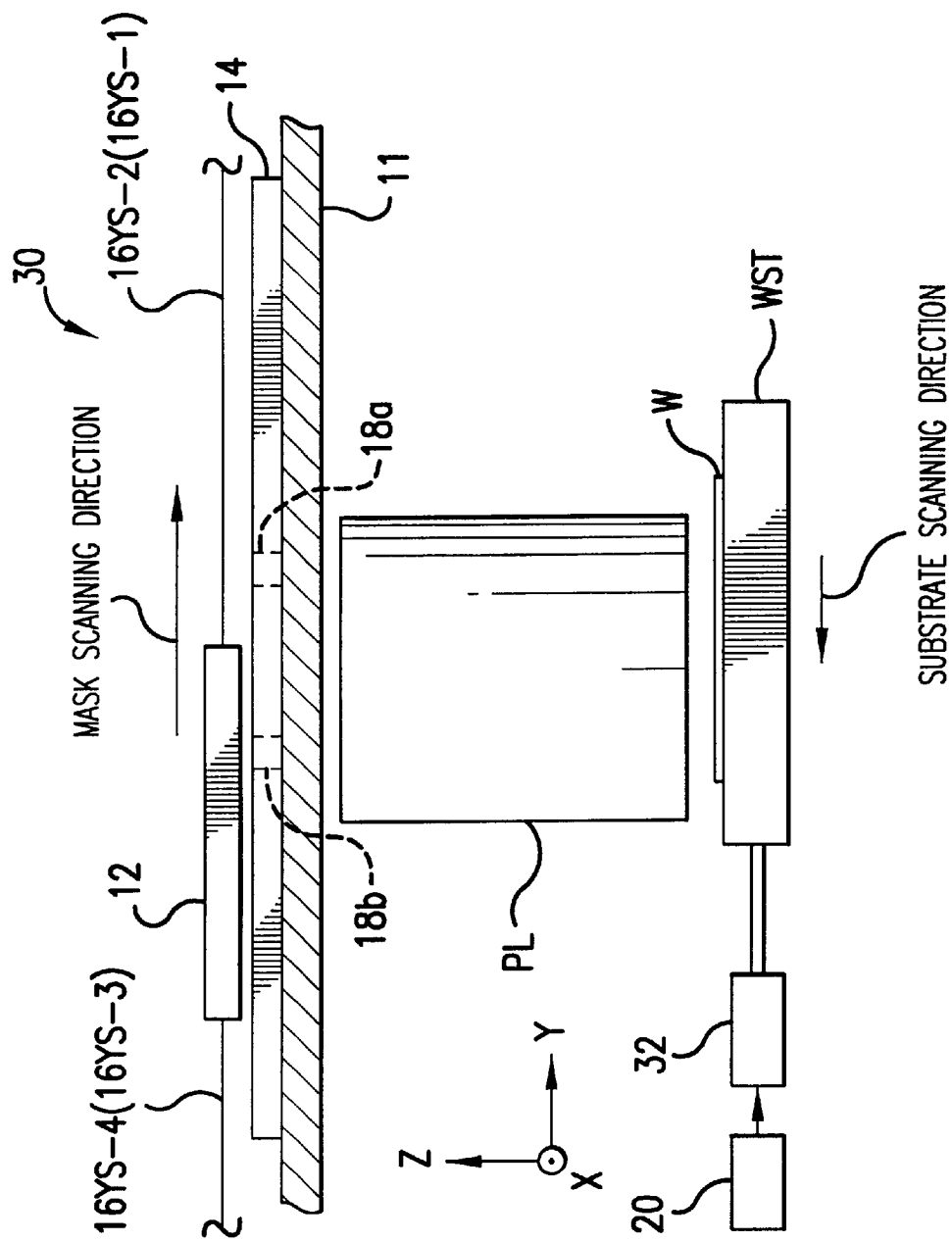
FIG. 5 is a side view showing the schematic structure of a projection exposure apparatus according to a second embodiment of the invention.

FIG. 5 shows the structure of a projection exposure apparatus 30 according to the second embodiment. The projection exposure apparatus 30 is what is called a scanning projection exposure apparatus that transfers a pattern image formed on a reticle 12 onto a wafer W by scanning the reticle 12 and the wafer W relative to a projection optical system PL according to the magnification of the projection optical system PL.

The projection exposure apparatus 30 has, as shown in FIG. 5, a reticle floating plate 14 extended in the mask scanning direction that allows the reticle 12 floating thereabove to move by at least a required distance (the sum of the reticle scanning distance necessary for exposure and the distance necessary for acceleration and deceleration of the reticle before and after exposure) in the mask scanning direction. Apparatus 30 also has control bars 16YS-1 to 16YS-4 having such a length as to secure a sufficient stroke to drive the reticle 12 in the mask scanning direction during scanning exposure, and a controller 20 that controls these components.

Since the second embodiment is of the scanning type that scans the reticle 12 and the wafer W relative to the projection optical system PL, the controller 20 executes position control by using the four control bars 16YS-1 to 16YS-4 extending in parallel with the mask scanning direction (the Y-axis direction) so that the reticle 12 moves in the mask scanning direction. Furthermore, the second embodiment does not employ the control bars 16XS-1 to 16XS-4 as in the first embodiment for controlling the position of the reticle 12 in the non-scanning direction (the X-axis direction) orthogonal to the mask scanning direction. This is because the reticle 12 moves dynamically in the mask scanning direction during exposure in the scanning projection exposure apparatus shown in FIG. 5 and friction arises and disturbs proper reticle scanning if control bars are in contact with the sides of the reticle 12 in the non-scanning direction. Accordingly, in the second embodiment, instead of controlling the position of the reticle 12 in the non-scanning direction, the position of the reticle is measured by using measuring axes BI1Y, BI2Y, and BI3X, and a wafer stage driving mechanism 32, serving as a moving mechanism, is controlled by the controller 20 so that the wafer stage WST follows the reticle 12 according to the measured reticle position.

According to the projection exposure apparatus 30, a pattern on the reticle 12 is illuminated in, for example, a rectangular illumination region with exposure light from an unillustrated illumination optical system, and an image of the pattern is projected onto the wafer W via the projection optical system PL by exposure. At this time, the reticle 12 is scanned toward the right side of FIG. 5 at a fixed velocity (herein a velocity V) with respect to the slit-like illumination region illuminated with exposure light, and the wafer W is synchronously scanned toward the left side of FIG. 5 at a fixed velocity V/β (1/β represents the reduction ratio of the projection optical system PL).

At such exposure, the reticle 12 is held floating at a fixed distance in the Z-axis direction by the pressure of air blown from the reticle floating plate 14 and continuously pressed on both sides thereof orthogonal to the mask scanning direction by the control bars 16YS-1 to 16YS-4 extending in the mask scanning direction. In scanning the reticle 12 in the mask scanning direction, the controller 20 executes control so that the control bars 16YS-3 and 16YS-4 push the reticle 12 in the mask scanning direction and the control bars 16YS-1 and 16YS-2 pull back with a force that is a little lower than that of the control bars 16YS-3 and 16YS-4 in synchronization with this push. (Actually since the control bars are not linked to the reticle 12 (although they contact the reticle 12), control bars 16YS-1 and 16YS-2 do not pull back on the reticle, but rather resist movement of the reticle with a force slightly less than the pushing force.)

As mentioned above, according to the second embodiment, since the reticle 12 is moved in the mask scanning direction by directly pressing the sides thereof by the control bars in the scanning projection exposure apparatus 30, the weight to be moved is substantially reduced as compared with the prior art that moves the reticle stage with the reticle mounted thereon. This makes it possible to increase the acceleration of the reticle in the acceleration and deceleration region before and after exposure and to thereby substantially improve throughput.

Furthermore, since the reticle 12 is moved by the control bars while being floated by the reticle floating plate 14 in the second embodiment, there is little frictional resistance. Accordingly, in addition to the above-mentioned reduction in weight to be moved, the reduction in frictional resistance allows the use of a smaller S driving force, and therefore a reduction in size and weight of the reticle driving mechanism.

Although the position of the reticle is controlled by the control bars 16YS-1 to 16YS-4 extending in parallel with the mask scanning direction in the second embodiment, the position in the non-scanning direction may also be controlled by using control bars extending in the non-scanning direction orthogonal to the mask scanning direction (for example, the control bars 16XS-1 to 16XS-4 shown in FIG. 1). In this case, friction arises between the leading ends of the non-scanning direction control bars and the sides of the reticle due to the dynamic movement of the reticle 12 in the mask scanning direction. Therefore, it is preferable to shape the leading end of each of the non-scanning direction control bars (for example, the control bars 16XS-1 to 16XS-4 shown in FIG. 1) like a ball or a roller in order to decrease the friction at the leading end. This makes it possible to control the position of the reticle 12 in the non-scanning direction while scanning the reticle 12 in the mask scanning direction.

Next, a third embodiment of the present invention will be described with reference to FIG. 6. Components that are identical with or equivalent to those in the aforesaid first and second embodiments are denoted by the same numerals, and a description thereof is simplified or omitted.

Figure 6:
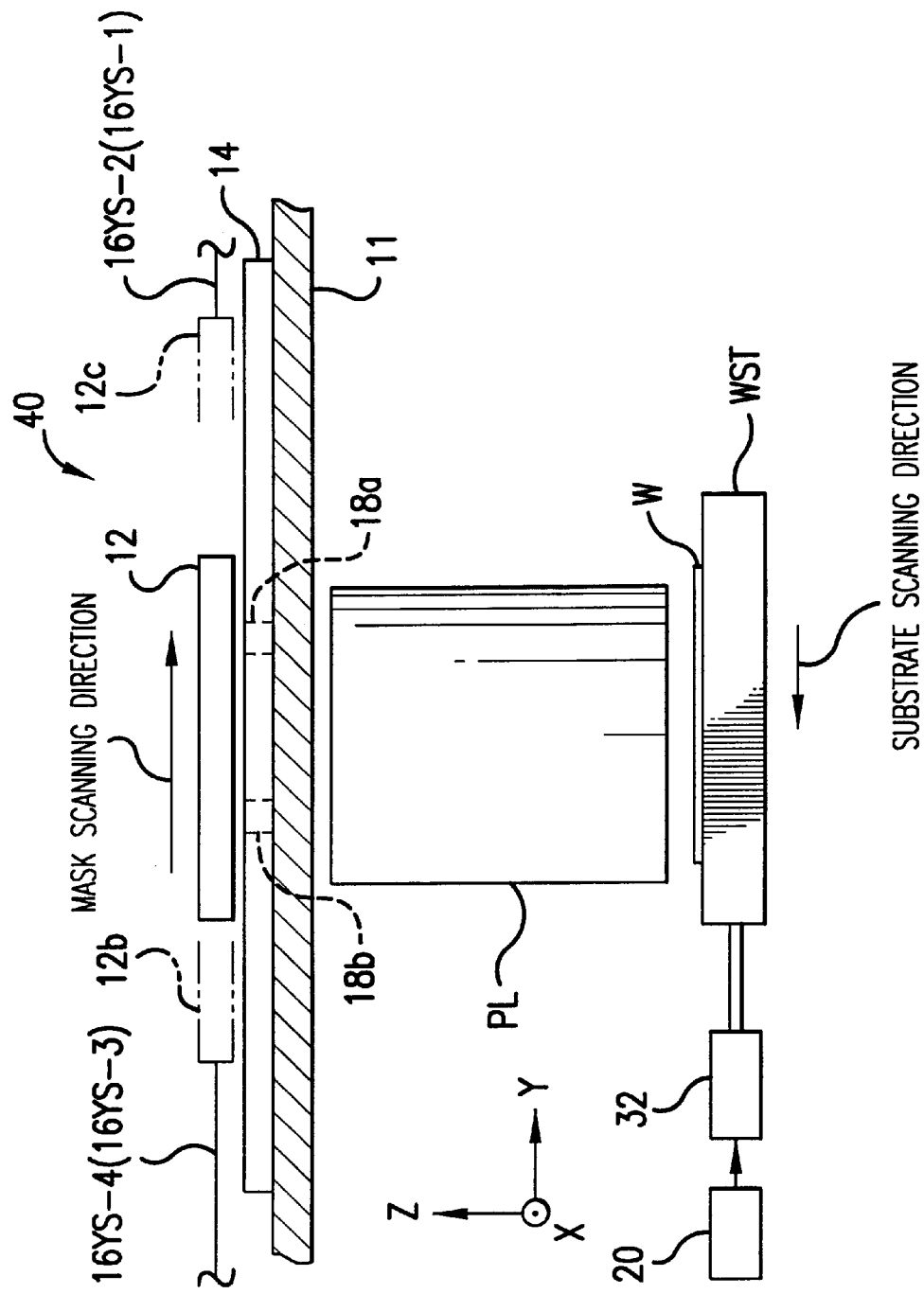
FIG. 6 is a side view showing the schematic structure of a projection exposure apparatus according to a third embodiment of the invention.

FIG. 6 shows the structure of a projection exposure apparatus 40 according to the third embodiment. The projection exposure apparatus 40 is a scanning projection exposure apparatus of a type similar to the second embodiment.

The third embodiment is characterized in that a reticle 12 is accelerated by actuating control bars 16YS-3 and 16YS-4 through a controller 20 at the beginning of scanning, is allowed to freely move at a constant velocity during exposure after having been accelerated to the scanning velocity, and is decelerated by actuating control bars 16YS-1 and 16YS-2 through the controller 20 after the completion of exposure. Of course, the control bars to be actuated during acceleration and deceleration are reversed from the above when scanning the reticle 12 in a reverse direction.

Next, the operation of the projection exposure apparatus 40 will be described. The controller 20 in the projection exposure apparatus 40 can push in and pull back the control bars 16YS-1 and 16YS-2 and the control bars 16YS-3 and 16YSA4 at a variable velocity and stop the control bars by controlling the driving of linear motors (see FIG. 1).

(1) First, the controller 20 gradually accelerates the reticle 12 in the mask scanning direction from the state in which the leading ends of the control bars 16YS-3 and 16YS-4 are butted against one side of the reticle 12 (see a reticle 12*b* shown by broken lines in FIG. 6).

(2) The controller 20 accelerates the reticle 12, and stops the motion of the control bars 16YS-3 and 16YS-4 the moment the velocity of the reticle 12 reaches the velocity needed for scanning exposure so that the reticle 12 is freely moved by an inertial force, whereby the reticle 12 moves at a constant scanning velocity over a reticle floating plate 14. The controller 20 controls a wafer stage driving mechanism 32 simultaneously with the control of the control bars in the above steps (1) and (2) so that exposure can be performed during the uniform motion of the reticle, and controls the wafer stage driving mechanism 32 so that the reticle 12 and a wafer W are synchronized during the above free motion of the reticle 12. Exposure is carried out during such synchronized scanning of the reticle 12 and the wafer W.

(3) After the completion of synchronized scanning of the reticle 12 and the wafer W, the controller 20 controls the driving of the control bars 16YS-1 and 16YS-2 and their contact with the other side of the reticle 12 so that they are pulled back in the scanning direction of the reticle 12 at a velocity a little lower than the scanning velocity of the reticle 12. Thereby, the other side of the reticle 12 gradually approaches the leading ends of the control bars 16YS-1 and 16YS-2, and then makes contact therewith. At the time when the other side of the reticle 12 and the control bars 16YS-1 and 16YS-2 are brought into contact, the controller 20 rapidly reduces the pull-back velocity of the control bars 16YS-1 and 16YS-2 in the mask scanning direction and stops the control bars. In this way, exposure is performed while a floating reticle is gently passed between two pairs of control bars in the third embodiment Next, a fourth embodiment of the present invention will be described with reference to FIGS. 7 and 8. Components that are identical with or equivalent to those in the aforesaid first to third embodiments are denoted by the same numerals, and a description thereof is simplified or omitted.

Figure 7:
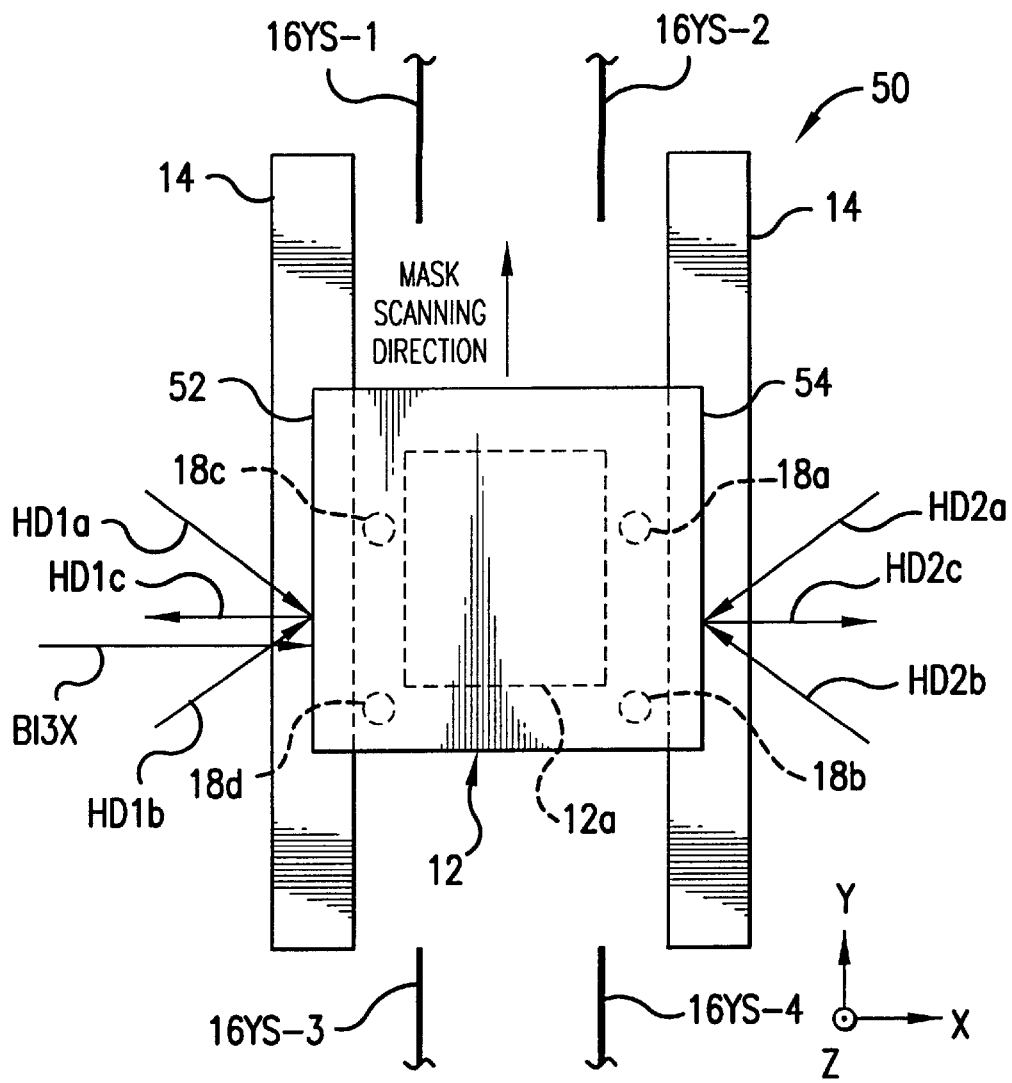
FIG. 7 is a plan view showing the schematic structure of a projection exposure apparatus according to a fourth embodiment of the invention.

FIG. 7 is a plan view showing the schematic structure of a projection exposure apparatus 50 according to the fourth embodiment.

The projection exposure apparatus 50 of the fourth embodiment is characterized in precisely detecting the position of a reticle 12 in the Y-axis mask scanning direction (up in FIG. 7) by measuring the positions of marks which are formed on sides 52 and 54 of the reticle 12 parallel to the mask scanning direction. The marks are detected from the non-scanning direction orthogonal to the mask scanning direction without using measuring axes of an interferometer in the same structure as that of the aforesaid apparatus of the third embodiment.

Figure 8:
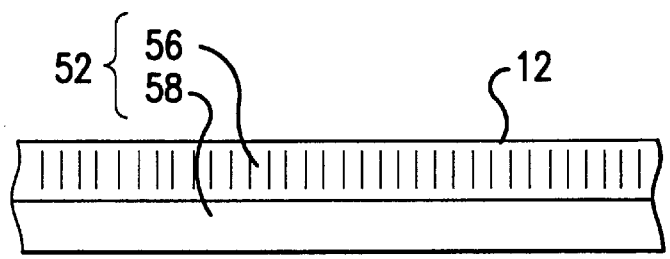
FIG. 8 is a view showing a grating mark engraved on the side of a reticle and a reflecting surface according to the fourth embodiment.

That is, in the projection exposure apparatus 50 shown in FIG. 7, a grating mark 56 with a predetermined pitch shown in FIG. 8 is formed on the side 52 of the reticle 12 in the non-scanning direction. A portion 58 of the side of the reticle does not include the grating mark 56. A pair of light beams HD1*a* and HD1*b* having slightly different oscillation frequencies are projected from an unillustrated interferometer onto the grating mark 56. Interference fringes, which move in the Y-axis direction at a predetermined velocity, are thereby produced on the surface with the mark 56, and a composite light beam HD1*c* of ±1 order is produced from the mark 56 in the non-scanning direction (the X-axis direction).

A photoelectric signal obtained by receiving the above composite light beam HD1*c* with the movement of the interference fringes is an AC signal with a particular frequency. Since the phase thereof changes with the movement of the reticle 12, the position of the reticle 12 can be detected based on the change of the phase. That is, there is employed a sensor similar to what is called a heterodyne LIA (Laser Interferometric Alignment) sensor. The above also applies to the other side 54 of the reticle 12 in the non-scanning direction, with the position of the reticle 12 being detected based on a composite light beam HD2c that is obtained by projecting light beams HD2a and HD2b.

Since the projection exposure apparatus 50 of the fourth embodiment dynamically moves the reticle 12 in the mask scanning direction, it is difficult to use the above-mentioned heterodyne double-beam interferometric method in measuring the position of the reticle 12 in the non-scanning direction. Therefore, the fourth embodiment measures the position of the reticle 12 in the non-scanning direction (the X-axis direction) by using a measuring axis BI3X as an interferometric beam projected from an unillustrated interferometer onto the side 52 of the reticle from the non-scanning direction, in the same manner as in the first embodiment.

When measurement is performed by projecting an interferometric beam from the mask scanning direction in the scanning projection exposure apparatus, since the length of the optical path in which the interferometric beam passes in the air substantially changes when scanning the reticle, the measurement is susceptible to fluctuations in the air, which lead to a measurement error. If the heterodyne double-beam interferometric method is adopted as in the fourth embodiment, however, since the optical path length of the light beam does not change even as the reticle 12 moves in the mask scanning direction, it is possible to precisely measure the position of the reticle in the mask scanning direction with little impact from fluctuations in the air.

When the pitch of the mark is set at, for example, about several micrometers, the LIA sensor can measure the position in the order of nanometers, and therefore, the position of the reticle in the mask scanning direction can be measured with higher accuracy.

As mentioned above, the invention has the excellent advantage, not obtained previously, of controlling the position of a mask so that the mask is in a desired position without reducing throughput even if the size of the mask is increased.

The invention also provides a projection exposure apparatus that can perform scanning exposure without reducing throughput even if the size of the mask is increased.

The invention also provides a projection exposure apparatus that can control the position and inclination of a mask in the direction of gravity and transfer a pattern image having good imaging characteristics onto a reactive substrate.

The invention also provides a projection exposure apparatus that can precisely measure the position of a mask in the mask scanning direction without being influenced by fluctuations in the air.

The invention is not limited to the described embodiments in which air pressure is utilized to float or levitate a reticle over a surface. For example, magnetic (particularly electromagnetic) forces can be used alone, or combined with air pressure, to float/levitate a reticle. In a system that relies upon electromagnetism, a magnetic material or coil would need to be provided on the mask.

While this invention has been described in conjunction with specific embodiments thereof, it is evident that many alternatives, modifications and variations will be apparent to those skilled in the art. Accordingly, the preferred embodiments of the invention set forth herein are intended to be illustrative, not limiting. Various changes may be made without departing from the spirit and scope of the invention as defined in the following claims.

What is claimed is:

1. A projection exposure apparatus for projecting an image of a pattern formed on a mask onto a reactive substrate via a projection optical system, comprising:

floating means for floating the mask above a surface of the floating means so that the floated mask has no contact with the surface of the floating means;

position control means for controlling a planar position of the floated mask in a plane by pressing at least one side of the floated mask;

position measuring means for measuring the planar position of the floated mask in the plane; and control means for controlling the position control means in accordance with the planar position of the floated mask measured by the position measuring means.

2. The projection exposure apparatus according to claim 1, further comprising:

moving means for moving the reactive substrate in a substrate scanning direction, wherein the control means projects the image of the pattern formed on the floated mask onto the reactive substrate via the projection optical system using scanning exposure by directing the position control means to move the floated mask in a mask scanning direction and synchronously directing the moving means to move the reactive substrate in the substrate scanning direction.

3. The projection exposure apparatus according to claim 2, further comprising:

gravity-direction position measuring means for measuring a floating position and an inclination of the floated mask in a direction of gravity, wherein the floating means independently adjusts a gap between the floated mask and the surface of the floating means at each of at least three points, and the control means controls the floating position and the inclination of the floated mask in the direction of gravity via the floating means based on the floating position and the inclination of the floated mask in the direction of gravity measured by the gravity-direction position measuring means.

4. The projection exposure apparatus according to claim 2, wherein the control means directs the position control means to accelerate the floated mask to a scanning velocity by pressing a first side of the floated mask orthogonal to the mask scanning direction before scanning exposure is performed, performs scanning exposure while the floated mask is not contacted by the position control means after a velocity of the floated mask reaches the scanning velocity, and decelerates the floated mask by contacting a second side of the floated mask opposite to the first side with the position control means after completion of scanning exposure.

5. The projection exposure apparatus according to claim 2, wherein the position measuring means measures the planar position of the floated mask in the mask scanning direction by radiating light onto a grating mark formed on one side of the floated mask parallel to the mask scanning direction.

6. The projection exposure apparatus according to claim 1, further comprising:

gravity-direction position measuring means for measuring a floating position and an inclination of the floated mask in a direction of gravity, wherein the floating means independently adjusts a gap between the floated mask and the surface of the floating means at each of at least three points, and the control means controls the floating position and the inclination of the floated mask in the direction of gravity via the floating means based on the floating position and the inclination of the floated mask in the direction of gravity measured by the gravity-direction position measuring means.

7. The projection exposure apparatus according to claim 1, wherein the floating means includes gas expelling means for expelling gas at a controlled pressure against a surface of the floated mask to cause the floated mask to float on an air cushion.

8. A projection exposure apparatus for projecting an image of a pattern formed on a mask onto a reactive substrate via a projection optical system, comprising:

a non-contact support system that causes the mask to float over a surface without contacting the floated mask;

a position controller in selective engagement with at least one side of the floated mask to control a planar position of the floated mask in a plane by selectively pressing the at least one side of the floated mask;

a position sensor that measures the planar position of the floated mask in the plane; and a controller coupled to the position controller and to the position sensor to control the position controller in accordance with the planar position of the floated mask measured by the position sensor.

9. The projection exposure apparatus according to claim 8, further comprising:

a substrate driver that moves the reactive substrate in a substrate scanning direction, wherein the controller is coupled to the substrate driver and controls the position controller and the substrate driver to cause projection of the image of the pattern formed on the floated mask onto the reactive substrate via the projection optical system by scanning exposure by directing the position controller to move the floated mask in a mask scanning direction and synchronously directing the substrate driver to move the reactive substrate in the substrate scanning direction.

10. The projection exposure apparatus according to claim 9, further comprising:

a gravity-direction position sensor that measures a floating position and an inclination of the floated mask in a direction of gravity, the gravity direction position sensor being coupled to the controller, wherein the controller causes the non-contact support system to independently adjust a gap between the floated mask and the surface at each of at least three points, to control the floating position and the inclination of the floated mask in the direction of gravity based on the floating position and the inclination of the floated mask in the direction of gravity measured by the gravity-direction position sensor.

11. The projection exposure apparatus according to claim 9, wherein the controller directs the position controller to accelerate the floated mask to a scanning velocity by pressing a first side of the floated mask orthogonal to the mask scanning direction before scanning exposure is performed, performs scanning exposure while the floated mask is not contacted by the position controller after a velocity of the floated mask reaches the scanning velocity, and decelerates the floated mask by contacting a second side of the floated mask opposite to the first side with the position controller after completion of scanning exposure.

12. The projection exposure apparatus according to claim 9, wherein the position sensor measures the planar position of the floated mask in the mask scanning direction by radiating light onto a grating mark formed on one side of the floated mask parallel to the mask scanning direction.

13. The projection exposure apparatus according to claim 8, further comprising:

a gravity-direction position sensor that measures a floating position and an inclination of the floated mask in a direction of gravity, the gravity direction position sensor being coupled to the controller, wherein the controller causes the non-contact support system to independently adjust a gap between the floated mask and the surface at each of at least three points, to control the floating position and the inclination of the floated mask in the direction of gravity based on the floating position and the inclination of the mask floated in the direction of gravity measured by the gravity-direction position sensor.

14. The projection exposure apparatus according to claim 8, wherein the non-contact support system includes a plurality of gas expelling ports that expel gas at a controlled pressure against a surface of the floated mask to cause the floated mask to float on an air cushion.

15. The projection exposure apparatus according to claim 8, wherein the position controller includes at least one linear motor having a control bar that contacts the at least one side of the floated mask.

16. A method of positioning a mask in a projection exposure apparatus that projects an image of a pattern formed on the mask onto a reactive substrate, the method comprising the steps of:

floating the mask above a surface without contacting the floated mask;

measuring a planar position of the floated mask in a plane; and controlling the planar position of the floated mask in the plane by pressing at least one side of the floated mask in accordance with the measured planar position of the floated mask.

17. The method of claim 16, further comprising the steps of:

moving a reactive substrate in a substrate scanning direction;

moving the floated mask in a mask scanning direction and synchronously moving the reactive substrate in the substrate scanning direction; and projecting an image of a pattern formed on the floated mask onto the reactive substrate via a projection optical system while the floated mask and the reactive substrate are synchronously moving.

18. The method of claim 17, further comprising the steps of:

measuring a floating position and an inclination of the floated mask in a direction of gravity;

independently adjusting a gap between the floated mask and the surface at each of at least three points; and controlling the floating position and the inclination of the floated mask in the direction of gravity based on the measured floating position and inclination of the floated mask in the direction of gravity.

19. The method of claim 17, further comprising the steps of:

accelerating the floated mask to a scanning velocity by pressing a first side of the floated mask orthogonal to the mask scanning direction before starting the projecting step;

performing the projecting step while the first side of the floated mask is not contacted after a velocity of the floated mask reaches the scanning velocity; and decelerating the floated mask by contacting a second side of the floated mask opposite to the first side after completion of the projecting step.

20. The method of claim 17, further comprising the step of:

measuring the planar position of the floated mask in the mask scanning direction by radiating light onto a grating mark formed on one side of the floated mask parallel to the mask scanning direction.

21. The method of claim 16, further comprising the steps of:

measuring a floating position and an inclination of the floated mask in a direction of gravity;

independently adjusting a gap between the floated mask and the surface at each of at least three points; and controlling the floating position and the inclination of the floated mask in the direction of gravity based on the measured floating position and inclination of the floated mask in the direction of gravity.

22. The method of claim 16, wherein the floating step includes expelling gas at a surface of the floated mask at a controlled pressure to cause the floated mask to float on an air cushion.

23. A projection exposure apparatus for projecting an image of a pattern formed on a mask onto a reactive substrate via a projection optical system, comprising:

a non-contact support system that causes the mask to float over a surface without contacting the floated mask;

a position controller in engagement with at least one side of the floated mask to control a planar position of the floated mask in a plane by pressing the at least one side of the floated mask; and a position sensor that incrementally measures the planar position of the floated mask in the plane.

24. A projection exposure apparatus comprising:

a non-contact support system that causes a mask plate to float over a surface without contacting the floated mask plate;

a position controller in engagement with the floated mask plate to control a position of the floated mask plate; and a position sensor that incrementally measures the position of the floated mask plate.

25. The projection exposure apparatus according to claim 24, wherein the position controller controls at least one of a planer position of the floated mask plate and an inclination of the floated mask plate.

26. The projection exposure apparatus according to claim 25, wherein the position sensor measures at least one of the planer position of the floated mask plate and the inclination of the floated mask plate.

27. The projection exposure apparatus according to claim 24, wherein the floated mask plate is a glass mask plate having a pattern.

28. A method of positioning a mask plate in a projection exposure apparatus, the method comprising the steps of:

floating the mask plate above a surface without contacting the floated mask plate;

incrementally measuring a position of the floated mask plate; and controlling the position of the floated mask plate by pressing at least one side of the floated mask plate.

29. A method according to claim 28, wherein the floated mask plate is a glass plate having a pattern.

* * * * *